United States Patent [19]

Thillays

[11] 3,739,241

[45] June 12, 1973

[54] ELECTROLUMINESCENT SEMICONDUCTOR DEVICE CONTAINING CURRENT-CONTROLLING RECTIFYING DEVICE

[75] Inventor: Jacques Claude Thillays, Herouville Saint Clair, France

[73] Assignee: U.S. Philips Corporation, New York, N.Y.

[22] Filed: Feb. 29, 1972

[21] Appl. No.: 230,409

[30] Foreign Application Priority Data

Mar. 1, 1971 France .............................. 7106973

[52] U.S. Cl...... 317/235 R, 317/235 N, 317/234 H, 317/234 E, 317/235 UA, 313/108 D

[51] Int. Cl.......................... H01l 11/00, H01l 15/00

[58] Field of Search ........................ 317/234, 3, 3.1, 317/4, 4.1, 27, 235, 31; 313/108 D

[56] References Cited

UNITED STATES PATENTS

| | | | |
|---|---|---|---|
| 3,354,316 | 11/1967 | Deverall | 317/235 |
| 3,421,203 | 1/1969 | Ullman et al. | 317/235 |
| 3,560,813 | 2/1971 | Phy | 317/234 |
| 3,609,475 | 9/1971 | Kaposhilin | 317/235 |
| 3,612,926 | 10/1971 | Zizelmann | 317/234 |
| 3,619,731 | 11/1971 | Baker | 317/234 |
| 3,639,770 | 2/1972 | Zizelmann | 317/234 |

FOREIGN PATENTS OR APPLICATIONS

| | | | |
|---|---|---|---|
| 1,503,716 | 10/1967 | France | 317/235 |

OTHER PUBLICATIONS

RCA Technical Notes; by Stocker et al.; No. 536 page 1 March 1962.

*Primary Examiner*—John W. Huckert
*Assistant Examiner*—Andrew J. James
*Attorney*—Frank R. Trifari

[57] ABSTRACT

An electroluminescent semiconductor device.

An electroluminescent device which is arranged in a partly transparent, protective housing which comprises two connections.

The device is characterized in that it comprises at least two semiconductor crystals of which one crystal shows an electroluminescnet junction and the other shows a rectifying junction. The junctions are connected in series in such manner that during operation of the device all junctions are in the forward direction or all junctions are in the reverse direction.

4 Claims, 4 Drawing Figures

Patented June 12, 1973 3,739,241

2 Sheets-Sheet 2

ELECTROLUMINESCENT SEMICONDUCTOR DEVICE CONTAINING CURRENT-CONTROLLING RECTIFYING DEVICE

The invention relates to an electroluminescent device which is disposed in a protective and at least partly transparent housing from which two metal connections project which are insulated from each other.

It is known that certain p-n junctions biased in the forward direction may be electroluminescent, which is a result of the recombination of electron-hole pairs, the frequency of the electroluminescent radiation which depends upon the nature of the semiconductor body lying in the infrared range or in the range of the visible light.

If the characteristic of the forward injected current $I_D$ is plotted graphically as a function of the forward voltage $V_D$, a curve is obtained which varies according to an exponential power and has a bend at a threshold voltage $V_S$ which serves as a limit for the luminescence or non-luminescence of the junction or of the diode; in fact, the electroluminescent diode emits radiations for a voltage $V_D$ equal to or higher than the voltage $V_S$.

It has been found that when such an electroluminescent diode is biased in the reverse direction, the diode does not stand a high voltage and does not emit light, but that it does supply a certain current so that a certain power dissipation thus occurs. In these circumstances the semiconductor material and hence the diode itself is rapidly damaged.

As a result of this, such an electroluminescent diode cannot be used in a device which operates on alternating current, not even when a current limitation is used.

It is also known that in the case of certain logical apparatus it is necessary to supervise the operation of the various elements hereof by means of luminescent indicators. For that purpose it is desirable to use electroluminescent diodes but usually the voltage available in said apparatus is approximately 5 to 6 volts, while the voltage which can be supplied to said electroluminescent diodes seldom exceeds 2 volts.

So far this requirement has made it impossible to directly use electroluminescent diodes as luminscent indicators in the said apparatus.

In order to enable the use of electroluminescent diodes, either with alternating current or with voltages which are higher than the threshold voltage of the diodes, it is known to connect one or several rectifying diodes in series and outside the electroluminescent diodes.

As a result of the use of a series of diodes in the outer circuit of the electroluminescent diode, the device occupies more space and thus impedes the minaturisation of devices in which it is necessary to incorporate an electroluminescent diode. On the other other hand it increases the possibility of wrong wiring and poor solderings.

It is the object of the present invention to avoid these drawbacks.

According to the invention, an electroluminescent device of the type mentioned in the preamble is characterized in that the device comprises at least two semiconductor crystals in each of which two regions of opposite conductivity types are provided as a result of which at least two junctions are obtained of which one is electroluminescent and ther other is or are rectifying and that one of the two regions of a first crystal is electrically connected to the region of the opposite conductivity type of a second crystal, the two other regions of the first and the second crystal being connected to the metal output connections.

In this manner a device is obtained in which half a cycle of the alternating current is suppressed due to the presence of at least one rectifying diode which blocks any stray reverse current and avoids the damage of the junction.

In addition, a voltage drop exists across every rectifying diode, as a result of which in the case of apt choice of the number of diodes and of the supply voltage it is possible to use such a device, for example, in logic apparatus.

Since the voltage drop across every rectifying diode is substantially the same for any input voltage, it is possible, by varying the input voltage, to control the lighting up and extinction of the electroluminescent diode. The device obtained in this manner is complete and on the one hand permits miniaturisation and on the other hand permits avoiding the problems regarding the wiring and the bad solderings.

In a first preferred embodiment, two crystals are soldered respectively to the two metal output connections.

In this case it is possible in assembling the device to check the two diodes separately after having connected them to the connections and hence it is possible to replace defective elements prior to assembly.

In addition, due to the fact that a crystal is placed on each of the connections, it is possible to obtain a better heat dissipation which permits of using said embodiment in devices embedded in a synthetic material.

A second preferred embodiment is characterized in that the crystals are arranged with one above the other, the first crystal, which comprises a rectifying junction, being soldered via one of its faces to one of the output connections. When the device comprises only two crystals, the second crystal which comprises the electroluminescent junction, is soldered to the other face of the first crystal. When the device comprises more than two crystals, the crystal having the electroluminescent junction is soldered on top of the crystals having rectifying junctions.

This embodiment provides the advantage that the assembly is rapid and simple even if the device comprises several rectifying diodes. This particularly compact embodiment moreover enables the manufacture of electroluminescent devices having small dimensions. On the other hand the device is particularly rigid and solid.

In order that the invention may be readily carried into effect, it will now be described in greater detail, by way of example, with reference to the accompanying drawing, in which.

Figure 1:
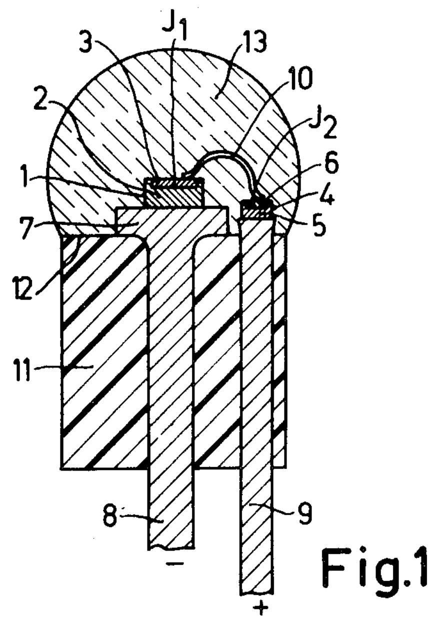
FIG. 1 is a diagrammatic cross-sectional view of a first embodiment of the electroluminescent device according to the invention.

It is to be noted that the dimensions in the drawing are considerably exaggerated and not drawn to scale for clarity.

The device shown in FIG. 1 comprises on the one hand a first semiconductor single crystal 1 having two regions 2 and 3, respectively, of opposite conductivity types n and p, respectively, which constitute an electroluminescent junction $J_1$, and on the other hand comprises a second semiconductor single crystal 4 having two regions 5 and 6, respectively, of the p and n type, respectively, which constitute a rectifying junction $J_2$. The first single crystal 1 is, for example, soldered to the plane surface of a metal plate 7 via its n region 2; this plate is the extremity of a first terminal the cylindrical pin 8 of which constitutes the elongation. The solder between the plate 7 and the crystal 1 constitutes a true ohmic contact. The plate 7 and the pin 8 preferably constitute one assembly.

On the plane surface of a second pin 9 the second single crystal 4 is soldered via its region 5 of the p-type. The region 3 of the single crystal 1 is connected via a connection wire 10 to the region 6 of the second single crystal 4.

The pins 8 and 9 pass through a bottom portion 11 of electrically insulating material, for example, a black thermal setting epoxy resin. Said cylindrical bottom portion 11 and the pin 8 are coaxial as a result of which the portion 11 and the crystal 1 with the electroluminescent junction $J_1$ are likewise coaxial.

The surface 12 of the insulating bottom portion 11 is covered by a thermosetting insulating transparent or translucent material in which the crystals 1 and 4, the plate 7, the extremity of the pin 9 and the connection 10 are embedded.

This insulating coating 13 is cast or moulded so as to obtain a hermetic screening for the crystals and the contacts.

The single crystal 1 preferably consists of gallium arsenide and the single crystal 4 of silicon. The plate 7, the pin 8 and the pin 9 consist of gold-plated ferro nickel while, as already stated, the portion 11 consists of epoxy resin. The coating 13 should have suitable thermosetting and optical properties; a resin which is commerically known as "Stratyl" is preferably used.

Conventional techniques may be used in the method of manufacturing devices according to the invention.

Figure 2:
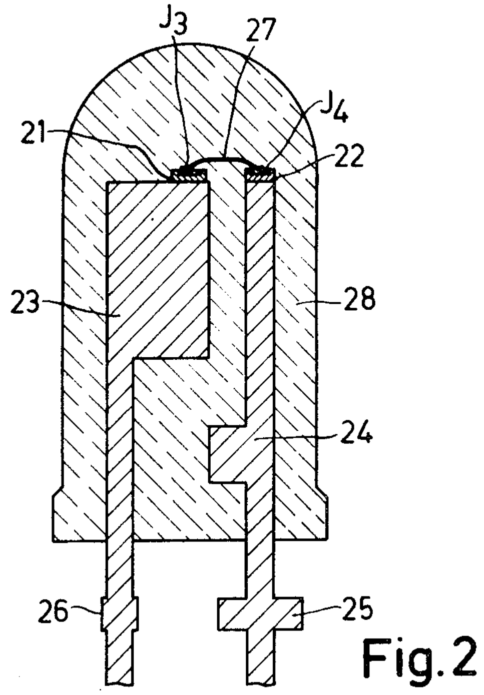
FIG. 2 is a diagrammatic cross-sectional view of a second embodiment of the electroluminescent device according to the invention.

As regards construction, the device shown in FIG. 2 is similar to the above described device. In fact, this device comprises two single crystals 21 and 22 in which junctions $J_3$ and $J_4$ were provided in the usual manner, the junction $J_3$ being electroluminescent and the junction $J_4$ being rectifying. These single crystals 21 and 22 are soldered to two metal connections 23 and 24. The connections 23 and 24 are strips of gold-plated copper and the crystals 21 and 22 are soldered to the narrow sides thereof. In order to avoid any long connection to the terminals of the supply circuit, the strips 23 and 24 show the portions 25 and 26 which have the shape of a "+" sign and a "−" sign, respectively.

The single crystals 21 and 22 are connected in series by the metal connection 27 and are embedded in a cylinder of coloured acryl synthetic resin 28.

Figure 3:
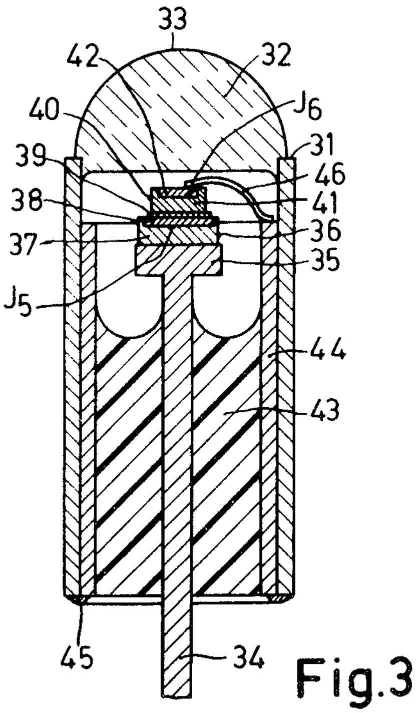
FIG. 3 is a cross-sectional view of a third embodiment of the electroluminescent device according to the invention.

The device shown in FIG. 3 comprises essentially an optic tube and a bottom portion which comprises and supports the two series connected diodes according to the invention.

The optic tube is constituted by a metal tube 31, usually of an iron-nickel-cobalt alloy, and by a converging lens 32 of glass which is of a good optical quality and can be soldered to the metal of the tube 31. The convex outer surface 33 of the lens preferably is substantially spheric and its inner surface is substantially plane. The tube and the lens are hermetically sealed together.

The bottom portion comprises a central metal pin 34 of an alloy of metal which can be soldered to glass and one extremity of which forms a plate 35. On the plane surface of this plate 35 the single crystal 36 is soldered which consists of two regions 37 and 38 of the n-type and p-type, respectively. A layer of metal 39, for example gold, is provided on the outer surface of the p-type region 38 as a result of which the single crystal 40 formed by the two regions 41 and 42 of the n-type and p-type, respectively, can be soldered. The junction $J_5$ between the regions 37 and 38 is rectifying, while the junction $J_6$ between the regions 41 and 42 is electroluminescent.

The insulation around the pin 34 is obtained by the glass sleeve 43 which itself is surrounded by a metal tube 44. The tubes 31 and 44 are soldered together according to a welded seam 45. The output conductors are constituted on the one hand by the pin 34, in which the electric contact is obtained by the soldering of the crystal 36 to the plate 35, and on the other hand by the tubes 31 and 44, in which the electric contact between said tube 44 and the region 42 of the single crystal 40 is obtained by a thermocompression bonded wire 46.

The sealing together of the metal parts and the glass parts may be carried out in any conventional manner.

Figure 4:
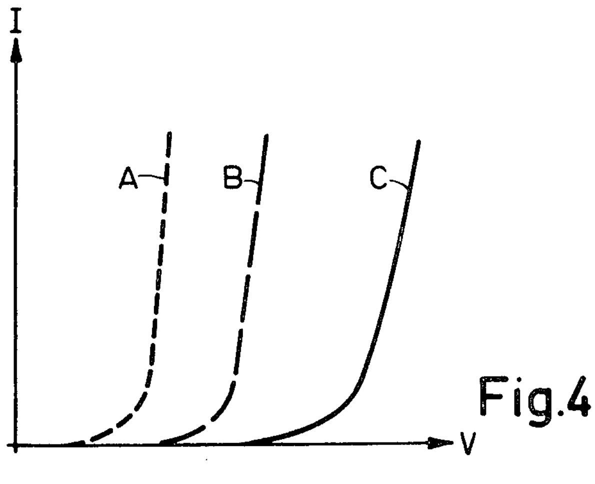
FIG. 4 shows the current-voltage characteristics of an electroluminescent device according to the invention.

FIG. 4 shows the characteristics $I=f(V)$ on the one hand of the rectifying junction (curve A) and of the electroluminescent diode (curve B), on the other hand of the whole device (curve C). It is to be noted that with respect to a single electroluminescent diode, the device according to the invention can be used at higher voltages with the current remaining the same.

What is claimed is:

1. An electroluminescent device comprising
   a. a protective housing of at least partly transparent material;
   b. two mutually electrically insulated output connection members individually having a first portion within said housing and a second portion projecting from said housing; and
   c. at least first and second semiconductor crystals in said housing, and individually comprising two regions of opposite conductivity types, said regions of said first crystal defining an electroluminescent junction and said regions of said second crystal defining a rectifying junction, said crystals being in series connection with each other with one of said regions of said first crystal being electrically connected to a region of opposite conductivity type of said second crystal, said junctions being polarized in the same direction, the other respective regions of said first and second crystals being electrically connected to respective said connection members, whereby said second crystal controls the current to said first crystal.

2. A device as recited in claim 1, wherein said first and second crystals are mounted on respective ones of said connection members.

3. A device as recited in claim 1, wherein said second crystal is mounted at a face thereof on one of said output connections and said first crystal is mounted on another opposite face of said second crystal.

4. A device as recited in claim 1, wherein said first crystal is located in the major axis of said protective housing.

* * * * *